(12) United States Patent
Li et al.

(10) Patent No.: US 10,528,463 B2
(45) Date of Patent: Jan. 7, 2020

(54) TECHNOLOGIES FOR COMBINING LOGICAL-TO-PHYSICAL ADDRESS TABLE UPDATES IN A SINGLE WRITE OPERATION

(71) Applicant: Intel Corporation, Santa Clara, CA (US)

(72) Inventors: Peng Li, Hillsboro, OR (US); Anand S. Ramalingam, Beaverton, OR (US); William K. Lui, Portland, OR (US); Sanjeev N. Trika, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 59 days.

(21) Appl. No.: 15/278,837

(22) Filed: Sep. 28, 2016

(65) Prior Publication Data

US 2018/0089076 A1 Mar. 29, 2018

(51) Int. Cl.
*G06F 12/02* (2006.01)
*G06F 3/06* (2006.01)
*G11C 14/00* (2006.01)

(52) U.S. Cl.
CPC ........ *G06F 12/0246* (2013.01); *G06F 3/0616* (2013.01); *G06F 3/0631* (2013.01); *G06F 3/0644* (2013.01); *G06F 3/0656* (2013.01); *G06F 3/0659* (2013.01); *G06F 3/0665* (2013.01); *G06F 3/0679* (2013.01); *G11C 14/0009* (2013.01); *G06F 2212/1036* (2013.01); *G06F 2212/152* (2013.01); *G06F 2212/214* (2013.01); *G06F 2212/651* (2013.01);
(Continued)

(58) Field of Classification Search
CPC .. G06F 12/0246; G06F 3/0631; G06F 3/0616; G06F 3/0679; G06F 3/0665; G06F 3/0656; G06F 3/0659; G06F 3/0644; G06F 2212/651; G06F 2212/152; G06F 2212/1036; G06F 2212/214; G06F 2212/7203; G06F 2212/7202; G06F 2212/7201; G11C 14/0009
USPC ................. 711/205, 206, 207, 129, 122, 133
See application file for complete search history.

(56) References Cited

U.S. PATENT DOCUMENTS 8,321,652 B2 11/2012 Hinz
9,389,792 B1 7/2016 Camp et al.
(Continued)

OTHER PUBLICATIONS

International search report for PCT application No. PCT/US2017/047392, dated Nov. 11, 2017 (7 pages).
(Continued)

*Primary Examiner* — Hong C Kim
(74) *Attorney, Agent, or Firm* — Barnes & Thornburg LLP

(57) ABSTRACT

Technologies for combining logical-to-physical address updates include a data storage device. The data storage device includes a non-volatile memory to store data and a logical to physical (L2P) table indicative of logical addresses and associated physical addresses of the data. Additionally, the data storage device includes a volatile memory to store one or more bins. Each bin is indicative of a subset of entries in the L2P table. Further, the data storage device includes a controller to allocate a bin in the volatile memory, write a plurality of updates to a subset of entries of the L2P table to the bin, and write the bin to the L2P table in a single write operation. Other embodiments are also described and claimed.

19 Claims, 9 Drawing Sheets

(52) U.S. Cl.
CPC ........... *G06F 2212/7201* (2013.01); *G06F 2212/7202* (2013.01); *G06F 2212/7203* (2013.01)

(56) References Cited

U.S. PATENT DOCUMENTS

| | | | |
|---|---|---|---|
| 2009/0158085 A1* | 6/2009 | Kern | G06F 11/1064 |
| | | | 714/6.13 |
| 2009/0113121 A1 | 7/2009 | Lee et al. | |
| 2010/0332730 A1 | 12/2010 | Royer, Jr. et al. | |
| 2014/0195725 A1* | 7/2014 | Bennett | G06F 12/0246 |
| | | | 711/103 |
| 2014/0325134 A1 | 10/2014 | Carpenter et al. | |
| 2015/0347026 A1* | 12/2015 | Thomas | G06F 3/0611 |
| | | | 711/103 |
| 2017/0322888 A1* | 11/2017 | Booth | G06F 3/0607 |

OTHER PUBLICATIONS

Written opinion for PCT application No. PCT/US2017/047392, dated Nov. 11, 2017 (8 pages).

\* cited by examiner

TECHNOLOGIES FOR COMBINING LOGICAL-TO-PHYSICAL ADDRESS TABLE UPDATES IN A SINGLE WRITE OPERATION

BACKGROUND

Typically, entries in a Logical-to-Physical (L2P) address table are 4 bytes each. However, to reduce error correction code (ECC) overhead, the size of a codeword used with the media (e.g. non-volatile memory of data storage device) that stores the L2P table is typically 128 bytes or more. The codeword size results in a write amplification of 32 times or more (e.g., writing 128 bytes to the L2P table to update 4 bytes of the 128 bytes). In such a process, a 128 byte section of the L2P table is read from the media, a 4 byte subsection is modified, and the resulting 128 byte section is written back to the media. It is relatively inefficient from a performance, power, and endurance perspective to perform a 4 byte read-modify-write L2P table update for every 4 kilobyte sequential write. This challenge also arises in data centers, where it is typical for writes to be larger than 4 kilobytes, but still random from an access pattern perspective. These large granularity writes also result in the same inefficiency challenge.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
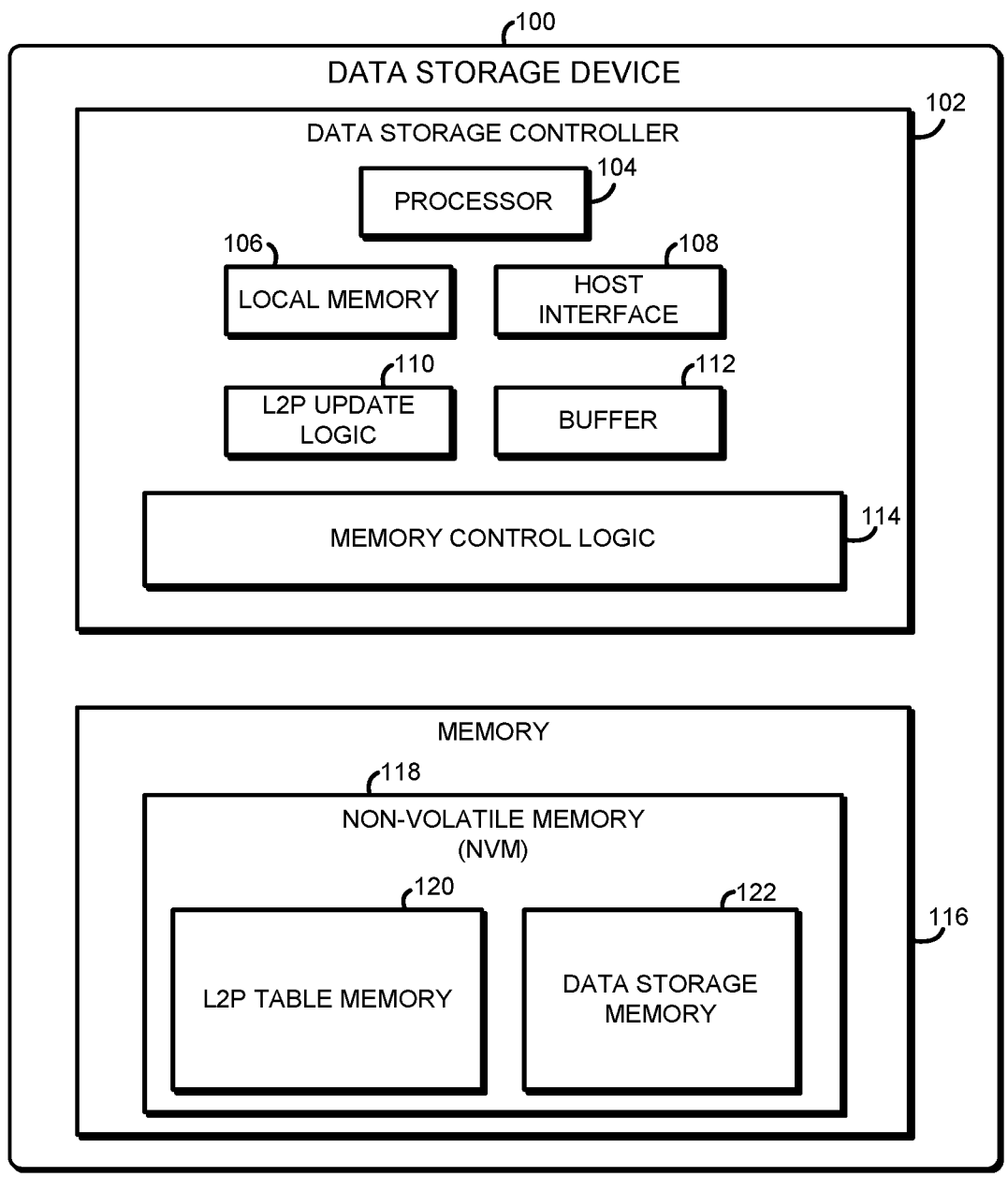
FIG. 1 is a simplified block diagram of at least one embodiment of a data storage device that includes a data storage controller for combing L2P updates.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As shown in FIG. 1, an illustrative data storage device 100 for combining Logical-to-Physical (L2P) address table updates includes a data storage controller 102 and a memory 116, which illustratively includes a non-volatile memory 118 that illustratively includes an L2P table memory 120 and a data storage memory 122. The data storage controller 102 uses the L2P address table to convert between contiguous logical addresses used by a host (e.g., a compute device that includes the data storage device 100) and potentially non-contiguous physical addresses in the non-volatile memory 118 of the data storage device 100. More specifically, while legacy data storage devices are block based, meaning data is stored in contiguous blocks, the data storage device 100 includes non-volatile memory 118 that is byte-addressable, meaning data is not necessarily stored in contiguous blocks. To maintain compatibility with software and buses designed for block based storage, the data storage device 100 maintains the L2P address table to convert between logical addresses used by the host and potentially non-contiguous physical addresses in the non-volatile memory 118. The data storage device 100 may be embodied as a hybrid data storage device 100, meaning the non-volatile memory 118 includes a combination of lower-cost non-volatile memory, such as NAND memory as the data storage memory 122, and a higher performance byte-addressable, write-in-place non-volatile memory as the L2P table memory 120. The combination of non-volatile memory types provides better quality of service (QoS), cost, uniformity, and other benefits over data storage devices that include only one type of non-volatile memory.

As discussed in more detail below, during use, the data storage controller 102 is configured to combine multiple L2P update operations into a single memory write to the media that stores an L2P table. By doing so, the embodiments of the technologies described herein reduce the write amplification typically associated with sequential write workloads, random write workloads with large sizes (e.g., larger than 4 kilobytes), and other workloads with high locality. In the illustrative embodiment, in use, the data storage device 100 defers L2P updates by caching them in a buffer and then writing the multiple updates in a single write operation. Further, the data storage controller 102 may read cached sections of the L2P table from the buffer for read operations, thereby reducing the read amplification that would typically occur due to the relatively large codeword size (e.g. 128 bytes) compared to the size of the L2P table entries (4 bytes). Further, as described herein, in the illustrative embodiment, the data storage device 100 is configured to write the buffer to non-volatile memory upon detecting an imminent power loss, to enhance the integrity and reliability of the L2P update scheme.

The data storage device 100 may be embodied as any type of device capable of storing data and performing the functions described herein. In the illustrative embodiment, the data storage device 100 is embodied as a solid state drive; however, in other embodiments, the data storage device 100 may embodied as a hard disk drive, a memory module device, a cache memory device, and/or other data storage device.

The data storage controller 102 of the data storage device 100 may be embodied as any type of control device, circuitry, or collection of hardware devices capable of combining logical-to-physical (L2P) address table (L2P table) updates and writing those updates to the L2P table in a single write operation. In the illustrative embodiment, the data storage controller 102 includes a processor or processing circuitry 104, local memory 106, a host interface 108, L2P update logic 110, a buffer 112, and memory control logic (also referred to herein as a "memory controller") 114. The memory controller 114 can be in the same die or integrated circuit as the processor 104 or the memory 106, 116 or in a separate die or integrated circuit than those of the processor 104 and the memory 106, 116. In some cases, the processor 104, the memory controller 114, and the memory 106, 116 can be implemented in a single die or integrated circuit. Of course, the data storage controller 102 may include additional devices, circuits, and/or components commonly found in a drive controller of a solid state drive in other embodiments.

The processor 104 may be embodied as any type of processor capable of performing the functions described herein. For example, the processor 104 may be embodied as a single or multi-core processor(s), digital signal processor, microcontroller, or other processor or processing/controlling circuit. Similarly, the local memory 106 may be embodied as any type of volatile and/or non-volatile memory or data storage capable of performing the functions described herein. In the illustrative embodiment, the local memory 106 is embodied as volatile memory. The volatile memory may be embodied as any storage medium that requires power to maintain the state of data stored by the medium. Examples of volatile memory may include various types of random access memory (RAM), such as dynamic random access memory (DRAM) or static random access memory (SRAM). One particular type of DRAM that may be used is synchronous dynamic random access memory (SDRAM). In particular embodiments, the DRAM complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage device 100 that implement such standards may be referred to as DDR-based interfaces. In the illustrative embodiment, the local memory 106 stores firmware and/or other instructions executable by the processor 104 to perform the described functions of the data storage controller 102. In some embodiments, the processor 104 and the local memory 106 may form a portion of a System-on-a-Chip (SoC) and be incorporated, along with other components of the data storage controller 102, onto a single integrated circuit chip.

The host interface 108 may also be embodied as any type of hardware processor, processing circuitry, input/output circuitry, and/or collection of components capable of facilitating communication of the data storage device 100 with a host device or service (e.g., a host application). That is, the host interface 108 embodies or establishes an interface for accessing data stored on the data storage device 100 (e.g., stored in the memory 116). To do so, the host interface 108 may be configured to utilize any suitable communication protocol and/or technology to facilitate communications with the data storage device 100 depending on the type of data storage device. For example, the host interface 108 may be configured to communicate with a host device or service using Serial Advanced Technology Attachment (SATA), Peripheral Component Interconnect express (PCIe), Serial Attached SCSI (SAS), Universal Serial Bus (USB), and/or other communication protocol and/or technology in some embodiments.

The L2P update logic 110 may be embodied as any device or circuitry capable of performing operations to identify logical-to-physical address table updates associated with data written to non-volatile memory of the data storage device 100, combine the updates into bins (e.g., groups), write each bin to the L2P table with a single write operation, and read L2P table updates from the bins at the request of the processor 104. A bin may be embodied as a portion or section of the local memory 106 designated or otherwise allocated for the storage of the L2P table updates. The L2P update logic 110 may be embodied as an application specific integrated circuit (ASIC), a field programmable gate array (FPGA), a dedicated microprocessor, or other hardware logic devices/circuitry. In some embodiments, the L2P update logic 110 is incorporated into the processor 104 rather than being a discrete component.

The buffer 112 of the data storage controller 102 is embodied as volatile memory used by the data storage controller 102 to temporarily store data that is being read from or written to the memory 116. The buffer 112 may also store bins of L2P table entries that have been read from an L2P table memory 120 and potentially modified, as described in more detail below. The particular size of the buffer 112 may be dependent on the total storage size of the memory 116. The memory control logic 114 is illustratively embodied as hardware circuitry and/or device configured to control the read/write access to data at particular storage locations of the memory 116.

The non-volatile memory 118 may be embodied as any type of data storage capable of storing data in a persistent manner (even if power is interrupted to the non-volatile memory 118). For example, in the illustrative embodiment, the non-volatile memory 118 is embodied as a combination of L2P table memory 120, which may be embodied as relatively high speed non-volatile memory such as byte-addressable, write-in-place non-volatile memory (e.g., 3D cross point memory, chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM) to store the L2P table, and data storage memory 122, which may be embodied as relatively slower memory, such as Flash memory (e.g., NAND memory) to store data at physical locations referenced by entries in the L2P table.

Figure 2:
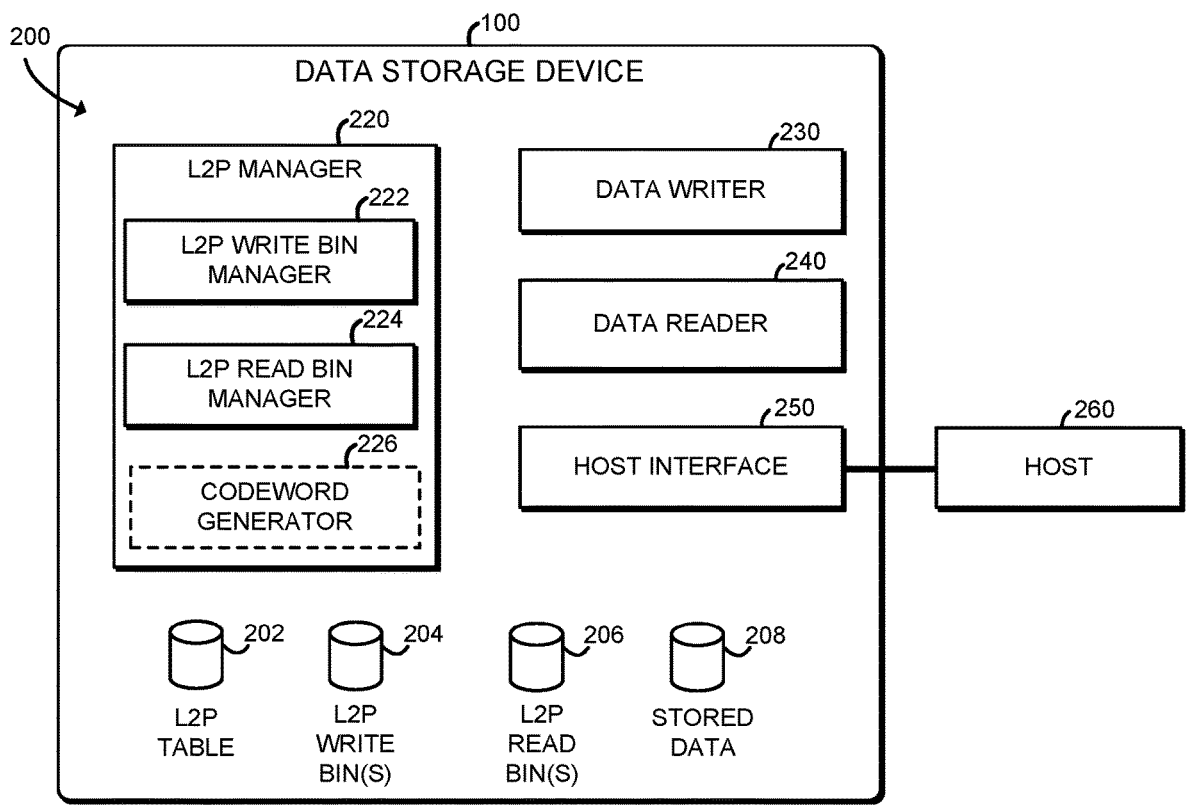
FIG. 2 is a simplified block diagram of at least one embodiment of an environment that may be established by the data storage device of FIG. 1.

Referring now to FIG. 2, in use, the data storage controller 102 of the data storage device 100 may establish an environment 200. The illustrative environment 200 includes an L2P manager 220, a data writer 230, a data reader 240, and a host interface 250. Each of the components of the environment 200 may be embodied as firmware, software, hardware, or a combination thereof. For example the various components and logic of the environment 200 may form a portion of, or otherwise be established by, the data storage controller 102 or other hardware components of the data storage device 100. As such, in some embodiments, any one or more of the components of the environment 200 may be embodied as a circuit or collection of electrical devices (e.g., an L2P manager circuit 220, a data writer circuit 230, a data reader circuit 240, a host interface circuit 250, etc.). In the illustrative environment 200, the environment 200 includes an L2P table 202, such as a set of entries that map logical addresses to physical addresses of data in the data storage memory 122. The environment 200 also includes one or more L2P write bins 204 representing subsets of contiguous entries in the L2P table 202 that have been read into a buffer or cache by the data storage controller 102 and may be modified by the data storage controller 102 to refer to new physical addresses in the data storage memory 122 as a result of a write operation. Additionally, the environment 200 includes L2P read bins 206 indicative of subsets of the L2P table 202 stored in a buffer of the data storage device 100 for efficient access when reading data from the non-volatile memory 118. Further, the environment 200 includes stored data 208, which, in the illustrative environment 200, is embodied as the actual data stored in the data storage memory 122 that is referenced by the entries of the L2P table 202, the L2P write bins 204, and the L2P read bins 206.

In the illustrative embodiment, the L2P manager 220, which may be embodied as hardware, firmware, software, virtualized hardware, emulated architecture, and/or a combination thereof as discussed above, is configured to manage the reading and writing of entries to the L2P table 202, including the generation and maintenance of bins representative of subsets of the L2P table 202, to reduce write amplification and read amplification associated with accessing the L2P table 202. To do so, in the illustrative embodiment, the L2P manager 120 includes an L2P write bin manager 222, an L2P read bin manager 224, and a codeword generator 226. The L2P write bin manager 222 is configured to cache, in the L2P write bins 204, updates to be made to the L2P table 202 and write each bin to the L2P table 202 in response to a predefined condition, such as in response to a determination that a new write operation is to be performed that does not apply to any of the L2P write bins 204 presently maintained in the volatile memory 106, 112 or in response to the detection of a power-loss-imminent condition. The L2P write bin manager 222 may select the L2P write bin 204 to write to the L2P table memory 120 based on a first-in first-out (FIFO) scheme, a least recently used (LRU) scheme, or any other suitable scheme. By caching the updates in the L2P write bins 204, the L2P write bin manager 222 causes multiple updates to L2P table entries in a particular bin to be written with one write operation, rather than performing a separate write operation for each entry. Accordingly, in embodiments in which the codeword or page size (e.g., 128 bytes) for the L2P table 202 is larger than the size of each L2P table entry (e.g., 4 bytes), the L2P write bin manager 222 reduces the write amplification that would otherwise occur when updating the L2P table 202.

In the illustrative embodiment, the L2P read bin manager 224 is configured to read a subset of entries, such as 32 entries, from the L2P table 202 in response to determining that a read operation is to be performed, and maintain the read entries in one of the L2P read bins 206. In subsequent read operations, the L2P read bin manager 224 may access one of the previously-read L2P table entries from one of the L2P read bins 206 rather than accessing the entries from the L2P table 202 in the L2P table memory 120. In embodiments in which the codeword or page size (e.g., 128 bytes) exceeds the size of an L2P entry (e.g., 4 bytes), the L2P read bin manager 224 may reduce the read amplification that would otherwise occur in such systems.

In the illustrative embodiment, the codeword generator 226 is configured to generate an error correction codeword for use by the data storage device 100 to ensure data integrity. As described above, in the illustrative embodiment, each codeword is larger in size than a given L2P table entry, to reduce overhead. For example, each codeword may be 128 bytes in size, while each L2P table entry is 4 bytes in size. As such, each codeword is representative of 32 entries in the L2P table 202. The codeword generator 226 may be configured to generate a codeword for a set of L2P table entries, including modified entries, from a particular L2P write bin 204 to be written to the L2P table 202 in response to a request from the L2P write bin manager 222. Likewise, in response to a request from the L2P read bin manager 224 to read a set of entries from the L2P table 202, the codeword generator 226 may read and decode a codeword associated with that set of entries to populate a corresponding L2P read bin 206.

It should be appreciated that each of the L2P write bin manager 222, the L2P read bin manager 224, and the codeword generator 226 may be separately embodied as hardware, firmware, software, virtualized hardware, emulated architecture, and/or a combination thereof. For example, the L2P write bin manager 222 may be embodied as a hardware component, while the L2P read bin manager 224 and the codeword generator 226 are embodied as virtualized hardware components or as some other combination of hardware, firmware, software, virtualized hardware, emulated architecture, and/or a combination thereof.

In the illustrative embodiment, the data writer 230, which may be embodied as hardware, firmware, software, virtualized hardware, emulated architecture, and/or a combination thereof as discussed above, is configured to write data at a physical address in the data storage memory 122 in response to a write request from the host 260. Similarly, the data reader 240, which may be embodied as hardware, firmware, software, virtualized hardware, emulated architecture, and/or a combination thereof as discussed above, is configured to read data from a physical address in the data storage memory 122 in response to a read request from the host 260. As should be appreciated, the data writer 230 and the data reader 240 communicate with the L2P manager to translate logical addresses to physical addresses and vice versa, based on data in L2P write bins 204, the L2P read bins 206, and the L2P table 202.

The host interface 250, which may be embodied as hardware, firmware, software, virtualized hardware, emulated architecture, and/or a combination thereof as discussed above, is configured to handle write requests and read requests received from a host 260, which may be embodied as an application, service, and/or other device. To do so, the host interface 250 may be configured to identify a received request and any data or parameters associated with the request, and transmit these items to the L2P manager 220, the data writer 230, or the data reader 240, depending on the type of request. In response to a write request to write data to a physical address in the non-volatile memory 118 in the data storage device 100, the host interface 250 may be configured to transmit a result of the request to the host 260, for example a confirmation that the write request was received and/or completed. In response to a read request, the host interface 250 may be configured to transmit the read data to the host 260.

Figure 3:
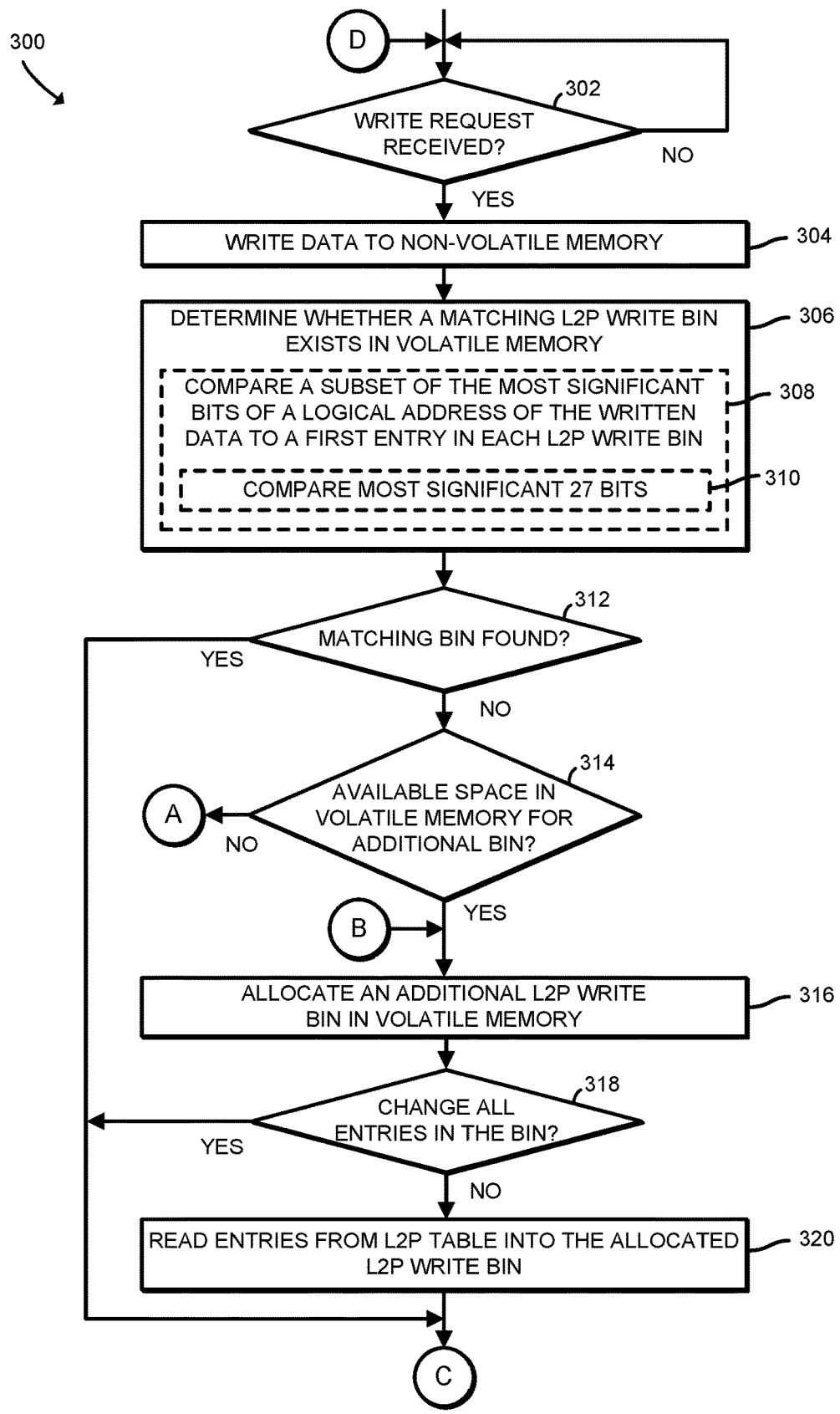
FIGS. 3-5 are a simplified flow diagram of at least one embodiment of a method for combining L2P address table updates that may be executed by the data storage device of FIG. 1.

Referring now to FIG. 3, in use, the data storage controller 102 of the data storage device 100 may execute a method 300 for combining L2P address table updates. The method 300 begins with block 302 in which the data storage controller 102 determines whether a write request has been received (e.g., from the host 260). If a write request has been received, the method 300 advances to block 304. In block 304, the data storage controller 102 writes the data of the write request to a physical address in the non-volatile memory 118. In doing so, in the illustrative embodiment, the data storage controller 102 writes the data to the data storage memory 122. In block 306, the data storage controller 102 determines whether a matching L2P write bin 204 is present in volatile memory (e.g., in the local memory 106 and/or the buffer 112). In doing so, in the illustrative embodiment, the data storage controller 102 compares a subset of the most significant bits of a logical address of the written data to a first entry in each L2P write bin 204, as indicated in block 308. In the illustrative embodiment, each logical address is 32 bits (i.e., 4 bytes) and each L2P write bin 204 contains 32 entries. Accordingly, the 5 least significant bits define the index of each entry within the L2P write bin 204 and the 27 most significant bits indicate which set of entries in the L2P table 202 a particular L2P write bin 204 is associated with. As such, in the illustrative embodiment, the data storage controller 102 compares the most significant 27 bits of the logical address of the written data to the 27 most significant bits of the first entry in each L2P write bin 204 to determine whether a match exists (i.e., whether the data was written to a logical address associated with one of the L2P write bins 204), as indicated in block 310.

In block 312, the data storage controller 102 performs a different set of operations based on whether a matching L2P write bin 204 was found in block 306. In response to a determination that a matching bin was not found, the method 300 advances to block 314 in which the data storage controller 102 determines whether the volatile memory (e.g., the local memory 106 or the buffer 112) includes available space for an additional L2P write bin 204. In doing so, in the illustrative embodiment, the data storage controller 102 may compare a number of available byes in the volatile memory 106, 112 to a size of an L2P write bin 204 (e.g., 128 bytes). In other embodiments, the data storage controller 102 may compare a number of L2P write bins 204 that are presently maintained in the volatile memory 106, 112 to a predefined limit (e.g., four). In response to a determination that the volatile memory 106, 112 has available space for an additional L2P write bin 204, the method 300 advances to block 316, in which the data storage controller 102 allocates an additional L2P write bin 204 in the volatile memory 106, 112. In block 318, the data storage controller 102 determines whether the data written in block 304 covers all of the logical addresses associated with the L2P write bin 204 that was allocated in block 316. In other words, the data storage controller 102 determines whether all of the physical addresses to be mapped to logical addresses in the L2P write bin 204 are new. In response to a determination that not all of the logical addresses associated with the L2P write bin 204 will have a new physical address, the method advances to block 320, in which the data storage controller 102 reads, from the L2P table 202, the entries associated with the logical addresses for the allocated L2P write bin 204.

Figure 4:
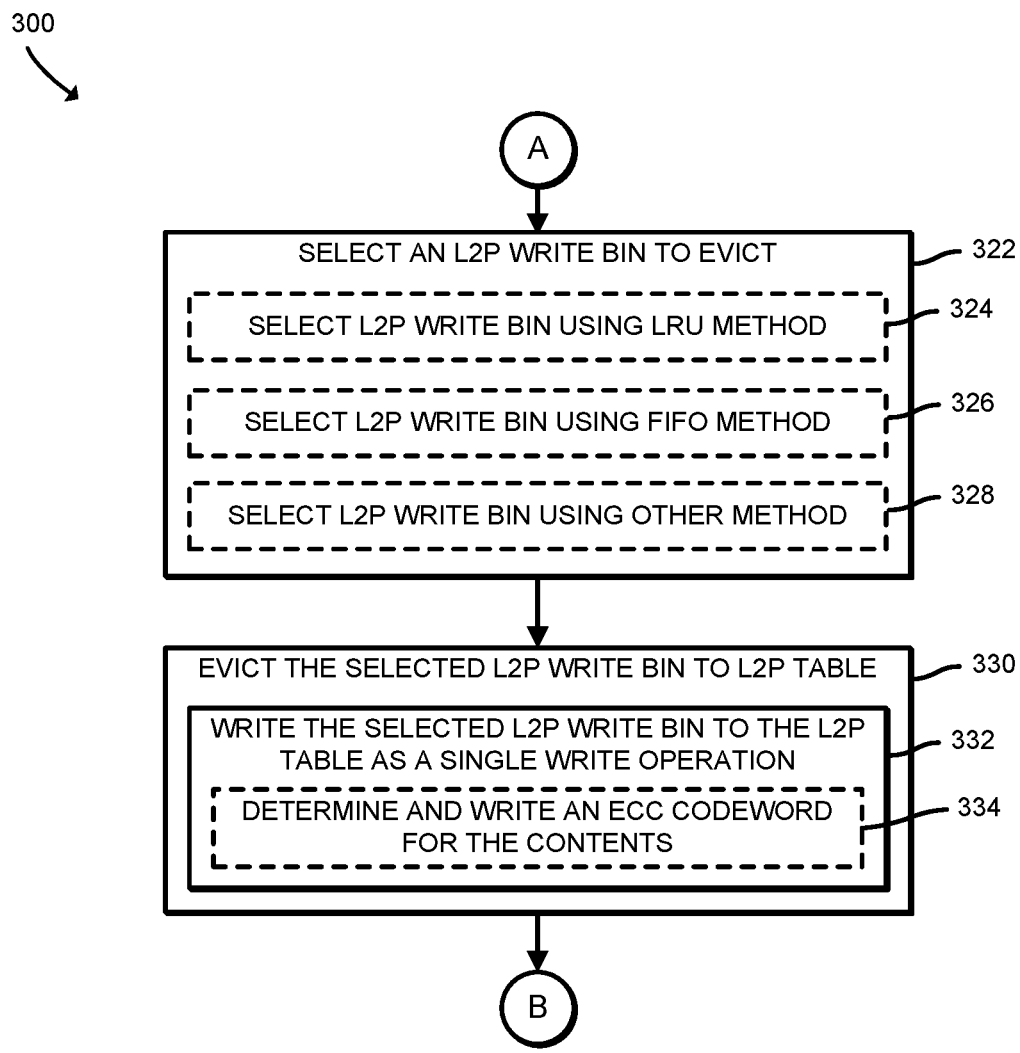

Referring back to block 314, if the data storage controller 102 instead determines that the volatile memory 106, 112 does not have available space for an additional L2P write bin 204, the method advances to block 322 of FIG. 4, in which the data storage controller 102 selects an L2P write bin 204 to evict. In doing so, as indicated in block 324, the data storage controller 102 may select the L2P write bin 204 to evict by selecting the least recently used L2P write bin 204. Alternatively, the data storage controller 102 may select the L2P write bin 204 to evict by using a first-in, first-out (FIFO) method, as indicated in block 326. In doing so, the data storage controller 102 may evict the L2P write bin 204 that is the oldest (i.e., allocated before any of the other L2P write bins 204 in the volatile memory 106, 112). In other embodiments, the data storage controller 102 may select the L2P write bin 204 to evict based on another method, as indicated in block 328.

After selecting the L2P write bin 204 to evict, the data storage controller 102 evicts the selected L2P write bin 204 to the L2P table 202 (i.e., to the L2P table memory 120), as indicated in block 330. In doing so, as indicated in block 332, the data storage controller 102 writes the contents of the selected L2P write bin 204 to the L2P table 202 in a single write operation. In other words, given that the granularity of accesses to the L2P table memory is, in the illustrative embodiment, 128 bytes, a single 128 byte write to the L2P table memory 120 covers all 32 entries of the L2P write bin 204. In writing the selected L2P write bin 204 to the L2P table memory 120, in the illustrative embodiment, the data storage controller 102 determines the ECC codeword representative of the entries in the L2P write bin 204 and writes the ECC codeword to the L2P table memory 120. Subsequently, the method 300 returns to block 316 of FIG. 1, to allocate an additional L2P write bin 204, as described above.

Figure 5:
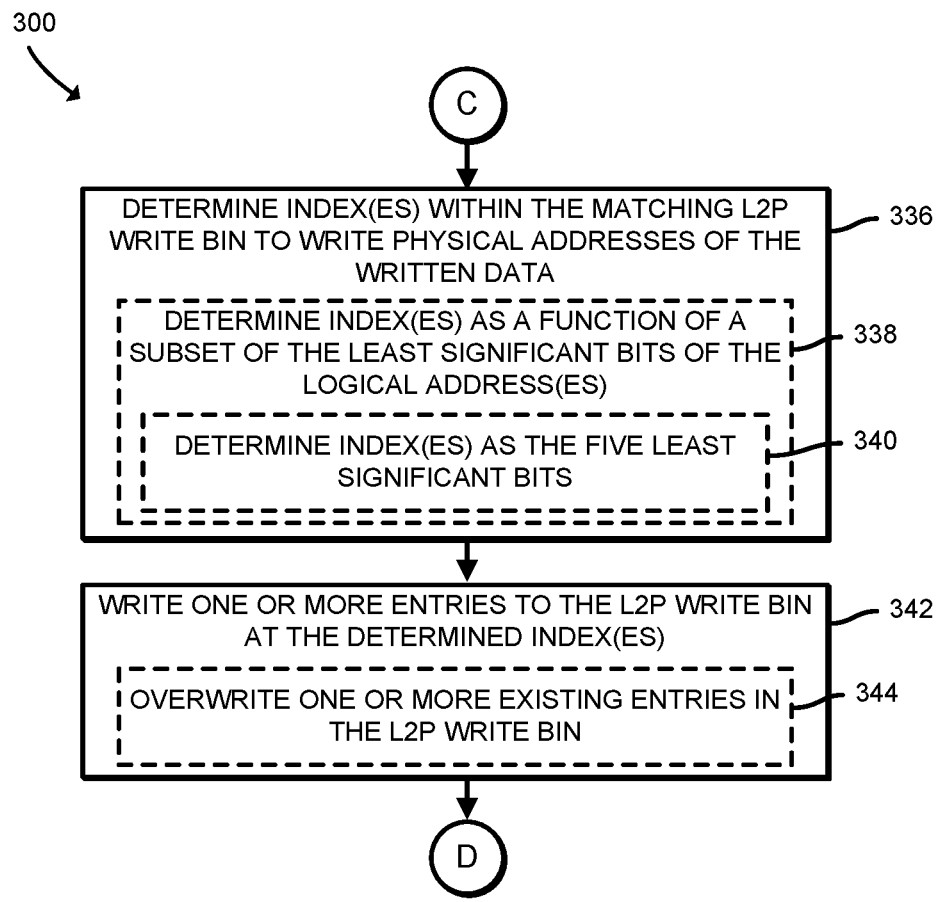

Referring back to block 312, if the data storage controller 102 determined that a matching L2P write bin 204 was found, or after reading entries from the L2P into a newly allocated L2P write bin 204 in block 320, the method 300 advances to block 336 of FIG. 5, in which the data storage controller 102 determines one or more indexes into the L2P write bin 204 that was matched or allocated, as described above, in which to write physical addresses of the stored data 208 (i.e., the data written in block 304). In doing so, in the illustrative embodiment, the data storage controller 102 determines the indexes as a function of a subset of the least significant bits of the logical addresses, as indicated in block 338. More particularly, in the illustrative embodiment, the data storage controller 102 determines the indexes as the five least significant bits (e.g., representing indexes of 0 to 31), as indicated in block 340. Subsequently, in block 342, the data storage controller 102 writes one or more entries to the L2P write bin 204 at the determined indexes from block 336. In doing so, the data storage controller 344 may overwrite one or more existing entries in the L2P write bin 204. This would occur when the data storage controller 102 has actually read the existing L2P entries for those logical addresses, as described with reference to blocks 318 and 320. By contrast, as explained above with reference to block 318, if every entry in the L2P write bin 204 will indicate a new physical address as a result of the write operation performed in block 304, then the data storage controller 102 avoids reading the existing L2P table entries into the L2P write bin 204, since all of those entries would be overwritten anyway. After writing the entries to the L2P write bin 204, the method 300 returns to block 302 of FIG. 3 to determine whether another write request has been received. As such, in the illustrative embodiment, the entries written to the L2P write bin 204 are not immediately written to the L2P table memory 120. Rather, in the illustrative embodiment, the L2P write bin 204 is only written in response to the L2P write bin 204 being selected for eviction, as described with reference to blocks 322 through 334 of FIG. 4, or in response to detecting a power-loss-imminent condition, as described in more detail herein. As a result, the entries in an L2P write bin 204 may be overwritten multiple times in the volatile memory 106, 112 before the L2P write bin 204 is written to the L2P table memory 120.

Figure 6:
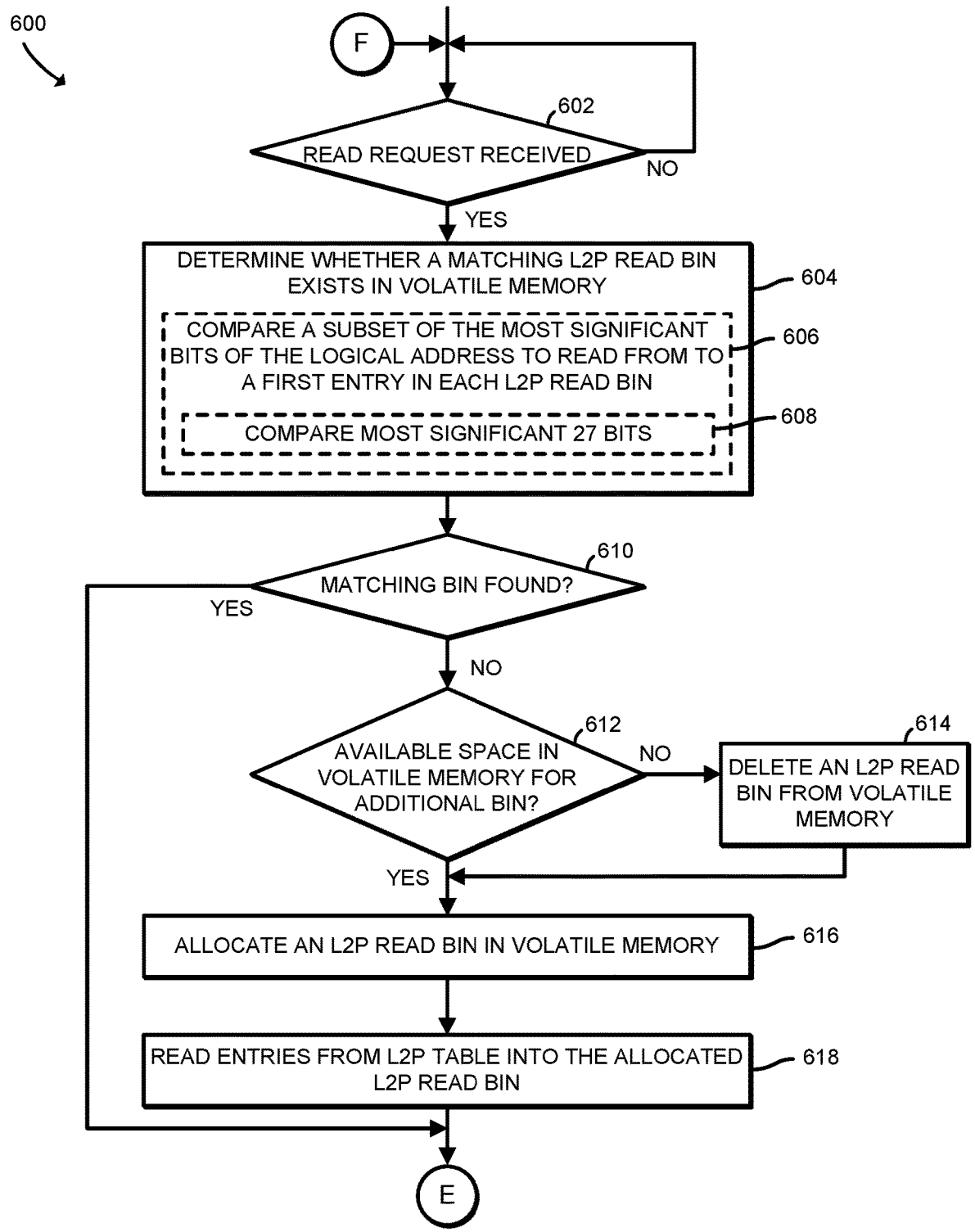
FIGS. 6 and 7 are a simplified flow diagram of at least one embodiment of a method for reading data when L2P address table entries have been cached in a buffer that may be executed by the data storage device of FIG. 1.

Referring now to FIG. 6, in use, the data storage controller 102 of the data storage device 100 may execute a method 600 for reading data using one or more L2P read bins 206 to cache L2P table entries. The method 600 begins with block 602 in which the data storage controller 102 determines whether a read request has been received (e.g., from the host 260). In response to a determination that a write request has been received, the method 600 advances to block 604, in which the data storage controller 102 determines whether a matching L2P read bin 206 is present in the volatile memory 106, 112. In doing so, in the illustrative embodiment, the data storage controller 102 compares a subset of the most significant bits of the logical address associated with the read request to a first entry in each L2P read bin 606. Further, in the illustrative embodiment, the data storage controller 102 compares the most significant 27 bits of the logical address to read from to the 27 most significant bits of the first entry in each L2P read bin 206 that is present in the volatile memory 106, 112. In block 610, the data storage controller 102 determines whether a matching L2P read bin 206 was found. In response to a determination that a matching bin was not found, the method 600 advances to block 612 in which the data storage controller 102 determines whether space is available in the volatile memory 106, 112 to allocate an additional L2P read bin 206. In doing so, the data storage controller 102 may compare a size of an L2P read bin 206 (e.g., 128 bytes) to the amount of available space in the volatile memory 106, 112, compare a number of L2P read bins 206 presently resident in the volatile memory 106, 112 to a threshold limit (e.g., four), or make the determination based on other factors. In response to a determination that there is not available space in the volatile memory 106, 112 for an additional L2P read bin 206, the data storage controller 102 deletes an L2P read bin from the volatile memory 106, 112 as indicated in block 614. In doing so, the data storage controller 102 may select the L2P read bin 206 to delete based on an LRU scheme, a FIFO scheme, or any other methodology. After deleting the L2P read bin 206 or determining that space is available for an additional L2P read bin 206, the data storage controller allocates an additional L2P read bin 206 as indicated in block 616. Subsequently, in block 618, the data storage controller 102 reads entries the from the L2P table into the allocated L2P read bin 206. As described above, in the illustrative embodiment, the granularity of writes and reads to and from the L2P table memory 120 is 128 bytes. Accordingly, in the illustrative embodiment, in reading the entries from the L2P table, the data storage controller 102 reads 32 consecutive four-byte entries associated with a page of the L2P table 202 that includes the logical address associated with the read request from the host 260.

Figure 7:
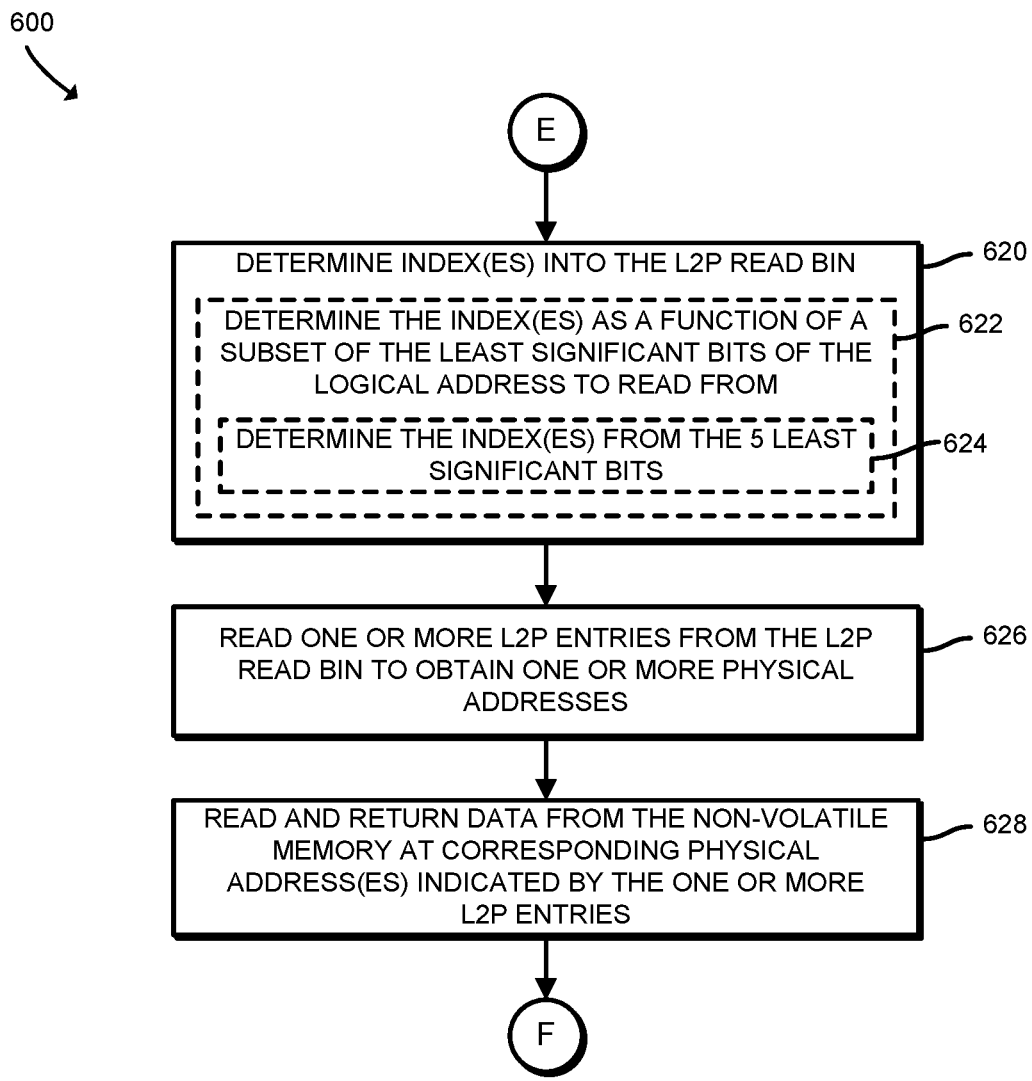

After reading the entries from the L2P table 202 into the L2P read bin 206, or in response to a determination that a matching L2P read bin 206 was found in the volatile memory 106, 112, the method 600 advances to block 620 of FIG. 7, in which the illustrative data storage controller 102 determines the index into the L2P read bin 620 of the entry that indicates the corresponding physical address to read from. In doing so, in block 622, the illustrative data storage controller 102 determines the one or more indexes as a function of a subset of the least significant bits of the logical address to read from. For example, in the illustrative embodiment, the data storage controller 102 may determine the one or more indexes from the five least significant bits of the logical address, which indicates an index between 0 and 31.

Subsequently, in block 626, the data storage controller 102 reads one or more L2P entries from the L2P read bin 206 to obtain one or more physical addresses to read from. In the illustrative embodiment, the physical addresses are addresses in the data storage memory 122 where the stored data 208 to be read is stored. After obtaining the one or more physical addresses, the method advances to block 628 in which the data storage controller 102 reads and returns data (e.g., the stored data 208) from the non-volatile memory 118 (e.g., the data storage memory 122) at the corresponding physical addresses indicated by the one or more L2P entries that the data storage controller 102 read from the L2P read bin 206 in block 626. Subsequently, the method 600 returns to block 602, in which the data storage controller 102 awaits another read request.

Figure 8:
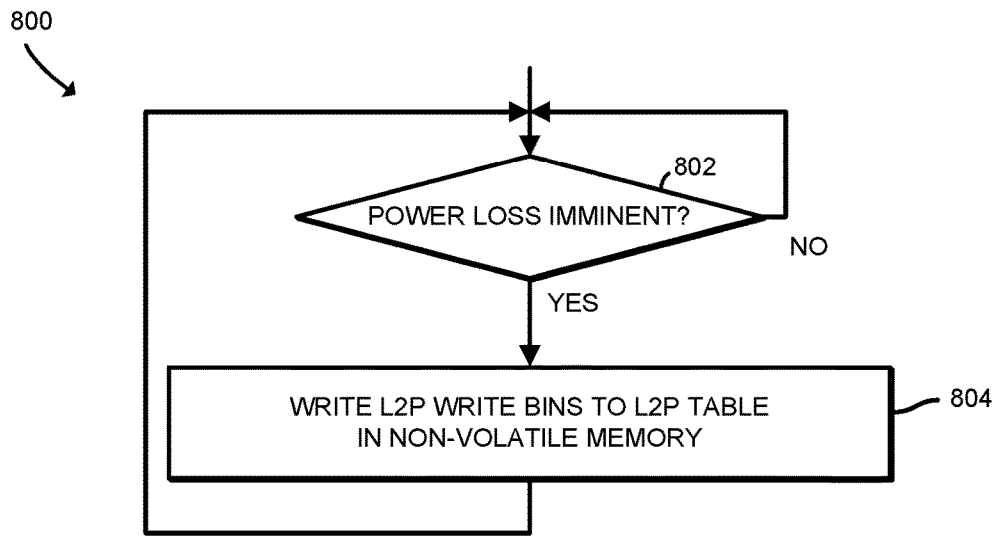
FIG. 8 is a simplified diagram of at least one embodiment of a method for writing cached L2P address table updates to non-volatile memory in response to the presence of a power-loss-imminent condition.

Referring now to FIG. 8, in use, the data storage controller 102 of the data storage device 100 may execute a method 800 for writing cached L2P address table updates to the non-volatile memory 118 in response to the presence of a power-loss-imminent (PLI) condition. The method 800 begins with block 802 in which the data storage controller 102 determines whether a power-loss-imminent condition is present. In doing so, the data storage controller 102 may receive a notification from the host 260 that the data storage device 100 will lose power imminently (i.e., within a predefined time frame), may determine that a voltage or current associated with one or more components (e.g., a capacitor) is indicative of a power-loss-imminent condition, or may make the determination based on other factors. Regardless, in response to a determination that a power-loss-imminent condition is present, the method 800 advances to block 804 in which the data storage controller 102 writes all of the L2P bins 204 from the volatile memory 106, 112 to the non-volatile memory (e.g., the L2P table memory 120). Subsequently, such as when power is restored to the data storage device 100, the method 800 returns to block 802 to await another power-loss-imminent condition. In the illustrative embodiment, the data storage controller 102 continually performs the method 800, contemporaneously with any other operations, to reduce the likelihood that updates in the L2P write bins 204 will be lost due to loss of power.

Figure 9:
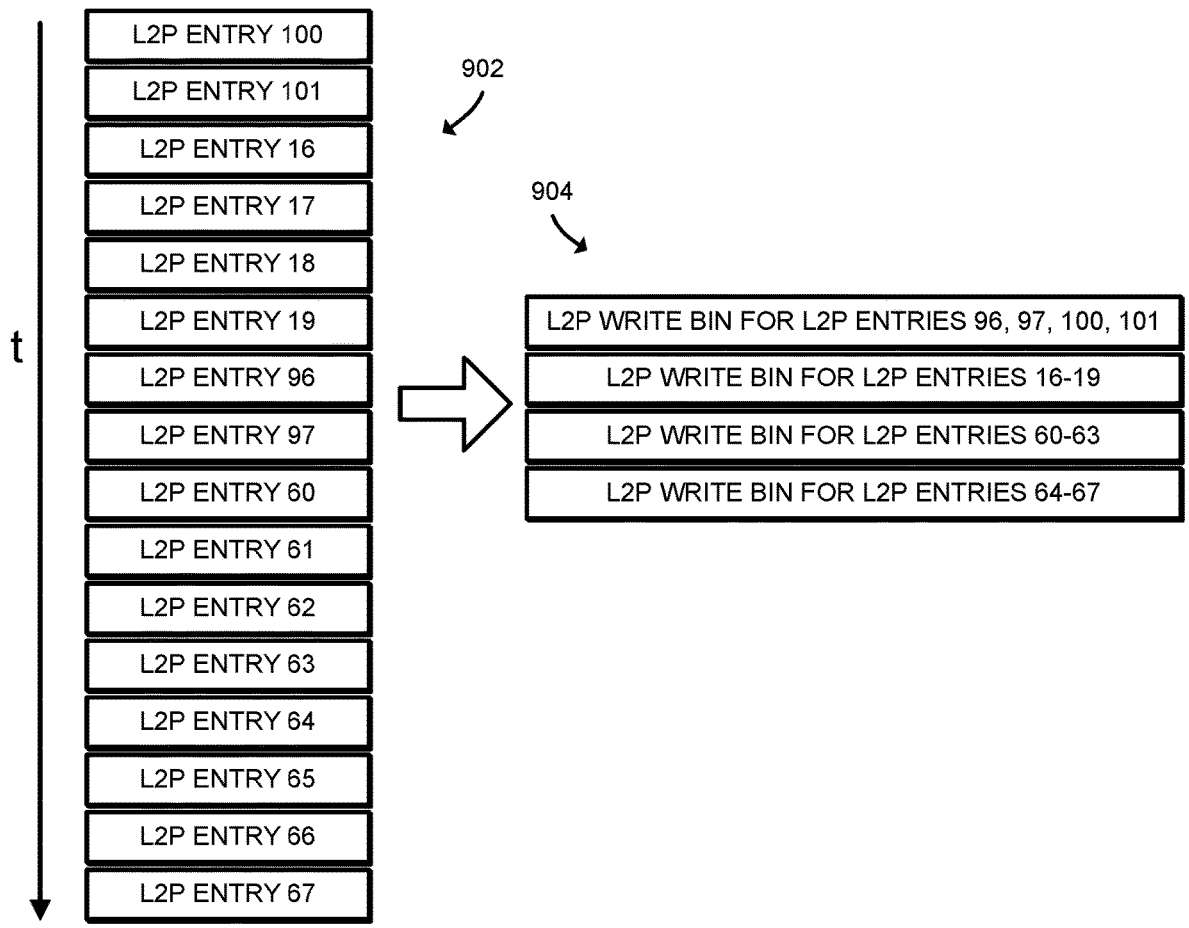
FIG. 9 is a simplified block diagram of at least one embodiment of a set of bins for L2P table updates that may be generated by the data storage device of FIG. 1.

Referring now to FIG. 9, the data storage controller 102 may perform a series of writes to the data storage memory 122 over time. In doing so, the data storage controller 102 generates updates 902 to the L2P table 202 to enable logical addresses to map to new physical addresses in the data storage memory 122 where the data was written. However, as described above, rather than performing a separate read-modify-write operation for each updated L2P table entry, the illustrative data storage controller identifies updates that can be combined into single read-write-modify operations and stores them in associated L2P write bins 904, similar to the L2P write bins 204. Further, the data storage controller 102 selectively writes the L2P write bins 204 to the L2P table memory 120 as described above with reference to the method 300 and the method 800.

Figure 10:
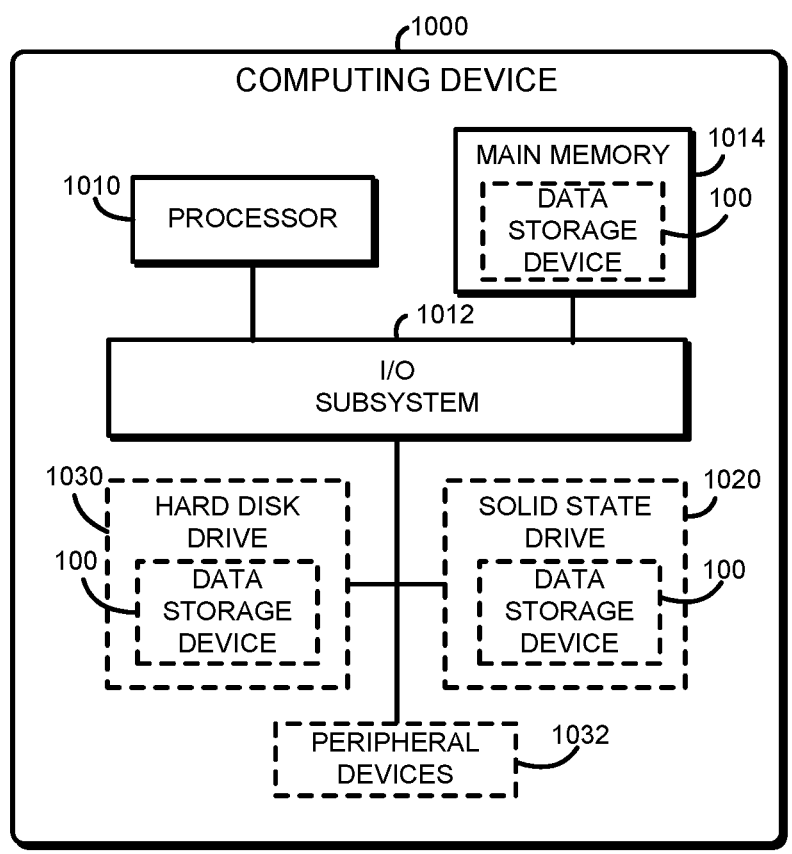
FIG. 10 is a simplified block diagram of at least one embodiment of a computing device including the data storage device of FIG. 1.

Referring now to FIG. 10, in some embodiments, the data storage device 100 may be incorporated in, or form a portion of, a computing device or other apparatus 1000. The computing device 1000 may be embodied as any type of computing device in which the data storage device 100 may be used. For example, the computing device 1000 may be embodied as a notebook, a laptop computer, a netbook, an Ultrabook™, a tablet computer, a smart phone, a wearable computing device, a pair of smart glasses, a head-mounted computing device, a cellular phone, a desktop computer, a smart device, a personal digital assistant, a mobile Internet device, a server, a data storage device, and/or any other computing/communication device. As shown in FIG. 10, the illustrative computing device 1000 includes a processor 1010, an input/output ("I/O") subsystem 1012, and a main memory 1014. Of course, the computing device 1000 may include other or additional components, such as those commonly found in a typical computing device (e.g., various input/output devices and/or other components), in other embodiments. Additionally, in some embodiments, one or more of the illustrative components may be incorporated in, or otherwise form a portion of, another component. For example, the memory 1014, or portions thereof, may be incorporated in the processor 1010 in some embodiments.

The processor 1010 may be embodied as any type of processor capable of performing the functions described herein. For example, the processor 1010 may be embodied as a single or multi-core processor(s), digital signal processor, microcontroller, or other processor or processing/controlling circuit. Similarly, the memory 1014 may be embodied as any type of volatile or non-volatile memory or data storage capable of performing the functions described herein. In operation, the memory 1014 may store various data and software used during operation of the computing device 1000 such as operating systems, applications, programs, libraries, and drivers. The memory 1014 is communicatively coupled to the processor 1010 via the I/O subsystem 1012, which may be embodied as circuitry and/or components to facilitate input/output operations with the processor 1010, the memory 1014, and other components of the computing device 1000. For example, the I/O subsystem 1012 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

As shown in FIG. 10, the data storage device 100 may be incorporated in, or form a portion of, one or more other components of the computing device 1000. For example, the data storage device 100 may be embodied as, or otherwise be included in, the main memory 1014. Additionally or alternatively, the data storage device 100 may be embodied as, or otherwise included in, a solid state drive 1020 of the computing device 1000. Further, in some embodiments, the data storage device 100 may be embodied as, or otherwise included in, a hard disk drive 1030 of the computing device 1000. Of course, in other embodiments, the data storage device 100 may be included in or form a portion of other components of the computing device 1000.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes a data storage device comprising a non-volatile memory to store (i) a logical to physical (L2P) table indicative of logical addresses and associated physical addresses of data and (ii) data at the physical addresses; a volatile memory to store one or more bins, wherein each bin is indicative of a subset of entries in the L2P table; and a controller to allocate a bin in the volatile memory; write a plurality of updates to a subset of entries of the L2P table to the bin; and write the bin to the L2P table in a single write operation.

Example 2 includes the subject matter of Example 1, and wherein the non-volatile memory comprises a first memory device that includes write-in-place, byte-addressable memory and a second memory device that includes a different type of non-volatile memory.

Example 3 includes the subject matter of any of Examples 1 and 2, and wherein the L2P table is to be stored in a first non-volatile memory device and the data is to be stored at physical addresses in a second memory device that is different from the first memory device.

Example 4 includes the subject matter of any of Examples 1-3, and wherein to allocate the bin in the volatile memory comprises to read a subset of the L2P table into the bin in the volatile memory.

Example 5 includes the subject matter of any of Examples 1-4, and wherein to write a plurality of updates to the subset of entries of the L2P table to the bin comprises to overwrite one or more entries in the bin.

Example 6 includes the subject matter of any of Examples 1-5, and wherein the controller is further to determine whether a bin that matches a subset of the L2P table that is to be updated is present in the volatile memory, and wherein to allocate the bin in the volatile memory comprises to allocate the bin in response to a determination that a bin that matches the subset of the L2P table is not present in the volatile memory.

Example 7 includes the subject matter of any of Examples 1-6, and wherein to determine whether a bin that matches the subset of the L2P table to be updated is present in the volatile memory comprises to compare a predefined number of bits of a logical address associated with the subset of the L2P table to be updated to at least one entry in each bin in the volatile memory.

Example 8 includes the subject matter of any of Examples 1-7, and wherein to compare a predefined number of bits comprises to compare the 27 most significant bits.

Example 9 includes the subject matter of any of Examples 1-8, and wherein the bin is a new bin, and the controller is further to evict an existing bin from the volatile memory to the non-volatile memory prior to the allocation of the new bin.

Example 10 includes the subject matter of any of Examples 1-9, and wherein the controller is further to update a codeword for the subset of the L2P table associated with the evicted bin.

Example 11 includes the subject matter of any of Examples 1-10, and wherein to write the plurality of updates to the bin comprises to determine an index of each update within the bin as a function of a subset of a logical address associated with each update.

Example 12 includes the subject matter of any of Examples 1-11, and wherein to determine the index of each update within the bin as a function of a subset of a logical address associated with each update comprises to determine the index as a function of the five least significant bits of the logical address associated with each update.

Example 13 includes the subject matter of any of Examples 1-12, and wherein the controller is further to determine whether a power-loss-imminent condition is present; and write, in response to a determination that a power-loss-imminent condition is present, each bin from the volatile memory to the non-volatile memory.

Example 14 includes the subject matter of any of Examples 1-13, and wherein the controller is further to receive a read request; determine a logical address associated with the read request; determine whether a bin associated with the logical address is present in the volatile memory; and read, in response to a determination that the bin associated with the logical address is present in memory, data from the non-volatile memory at a physical address indicated by an entry in the bin.

Example 15 includes the subject matter of any of Examples 1-14, and wherein the controller is further to receive a read request; determine a logical address associated with the read request; determine whether a bin associated with the logical address is present in the volatile memory; allocate, in response to a determination that the bin associated with the logical address is not present in the volatile memory, a new bin; read a subset of the L2P table associated with the logical address into the allocated bin; and read data from the non-volatile memory at a physical address indicated by an entry in the allocated bin.

Example 16 includes a method comprising allocating, by a controller of a data storage device, a bin in a volatile memory of the data storage device, wherein the bin is indicative of a subset of entries in a logical-to-physical (L2P) table stored in a non-volatile memory of the data storage device, and wherein the L2P table is indicative of logical addresses and associated physical addresses of data; writing, by the controller, a plurality of updates to a subset of entries of the L2P table to the bin; and writing, by the controller, the bin to the L2P table in a single write operation.

Example 17 includes the subject matter of Example 16, and wherein writing the bin to the L2P table comprises writing the bin to a first memory device that includes non-volatile, write-in-place, byte-addressable memory and a second memory device that includes a different type of non-volatile memory.

Example 18 includes the subject matter of any of Examples 16 and 17, and further including storing, by the controller, the L2P table in a first non-volatile memory device; and storing, in a second memory device that is different from the first memory device, data at a physical addresses referenced by the L2P table.

Example 19 includes the subject matter of any of Examples 16-18, and wherein allocating the bin in the volatile memory comprises reading a subset of the L2P table into the bin in the volatile memory.

Example 20 includes the subject matter of any of Examples 16-19, and wherein writing a plurality of updates to the subset of entries of the L2P table to the bin comprises overwriting one or more entries in the bin.

Example 21 includes the subject matter of any of Examples 16-20, and further including determining, by the controller, whether a bin that matches a subset of the L2P table that is to be updated is present in the volatile memory, and wherein allocating the bin in the volatile memory comprises allocating the bin in response to a determination that a bin that matches the subset of the L2P table is not present in the volatile memory.

Example 22 includes the subject matter of any of Examples 16-21, and wherein determining whether a bin that matches the subset of the L2P table to be updated is present in the volatile memory comprises comparing a predefined number of bits of a logical address associated with the subset of the L2P table to be updated to at least one entry in each bin in the volatile memory.

Example 23 includes the subject matter of any of Examples 16-22, and wherein comparing a predefined number of bits comprises comparing the 27 most significant bits.

Example 24 includes the subject matter of any of Examples 16-23, and wherein the bin is a new bin, and the method further comprises evicting an existing bin from the volatile memory to the non-volatile memory prior to allocating the new bin.

Example 25 includes the subject matter of any of Examples 16-24, and further including updating a codeword for the subset of the L2P table associated with the evicted bin.

Example 26 includes the subject matter of any of Examples 16-25, and wherein writing the plurality of updates to the bin comprises determining an index of each update within the bin as a function of a subset of a logical address associated with each update.

Example 27 includes the subject matter of any of Examples 16-26, and wherein determining the index of each update within the bin as a function of a subset of a logical address associated with each update comprises determining the index as a function of the 5 least significant bits of the logical address associated with each update.

Example 28 includes the subject matter of any of Examples 16-27, and further including determining, by the controller, whether a power-loss-imminent condition is present; and writing, in response to a determination that a power-loss-imminent condition is present, each bin from the volatile memory to the non-volatile memory.

Example 29 includes the subject matter of any of Examples 16-28, and further including receiving, by the controller, a read request; determining, by the controller, a logical address associated with the read request; determining, by the controller, whether a bin associated with the logical address is present in the volatile memory; and reading, by the controller and in response to a determination that the bin associated with the logical address is present in memory, data from the non-volatile memory at a physical address indicated by an entry in the bin.

Example 30 includes the subject matter of any of Examples 16-29, and further including receiving, by the controller, a read request; determining, by the controller, a logical address associated with the read request; determining, by the controller, whether a bin associated with the logical address is present in the volatile memory; allocating, by the controller and in response to a determination that the bin associated with the logical address is not present in the volatile memory, a new bin; reading, by the controller, a subset of the L2P table associated with the logical address into the allocated bin; and reading, by the controller, data from the non-volatile memory at a physical address indicated by an entry in the allocated bin.

Example 31 includes one or more machine-readable storage media comprising a plurality of instructions stored thereon that, when executed, cause a data storage device to perform the method of any of Examples 16-30.

Example 32 includes a data storage device comprising means for allocating a bin in a volatile memory of the data storage device, wherein the bin is indicative of a subset of entries in a logical-to-physical (L2P) table stored in a non-volatile memory of the data storage device, and wherein the L2P table is indicative of logical addresses and associated physical addresses of data; means for writing a plurality of updates to a subset of entries of the L2P table to the bin; and means for writing the bin to the L2P table in a single write operation.

Example 33 includes the subject matter of Example 32, and wherein the means for writing the bin to the L2P table comprises means for writing the bin to a first memory device that includes non-volatile, write-in-place, byte-addressable memory and a second memory device that includes a different type of non-volatile memory.

Example 34 includes the subject matter of any of Examples 32 and 33, and further including means for storing the L2P table in a first non-volatile memory device; and means for storing, in a second memory device that is different from the first memory device, data at a physical addresses referenced by the L2P table.

Example 35 includes the subject matter of any of Examples 32-34, and wherein the means for allocating the bin in the volatile memory comprises means for reading a subset of the L2P table into the bin in the volatile memory.

Example 36 includes the subject matter of any of Examples 32-35, and wherein the means for writing a plurality of updates to the subset of entries of the L2P table to the bin comprises means for overwriting one or more entries in the bin.

Example 37 includes the subject matter of any of Examples 32-36, and further including means for determining whether a bin that matches a subset of the L2P table that is to be updated is present in the volatile memory, and wherein the means for allocating the bin in the volatile memory comprises means for allocating the bin in response to a determination that a bin that matches the subset of the L2P table is not present in the volatile memory.

Example 38 includes the subject matter of any of Examples 32-37, and wherein the means for determining whether a bin that matches the subset of the L2P table to be updated is present in the volatile memory comprises means for comparing a predefined number of bits of a logical address associated with the subset of the L2P table to be updated to at least one entry in each bin in the volatile memory.

Example 39 includes the subject matter of any of Examples 32-38, and wherein the means for comparing a predefined number of bits comprises means for comparing the 27 most significant bits.

Example 40 includes the subject matter of any of Examples 32-39, and wherein the bin is a new bin, and the data storage device further comprises means for evicting an existing bin from the volatile memory to the non-volatile memory prior to allocating the new bin.

Example 41 includes the subject matter of any of Examples 32-40, and further including means for updating a codeword for the subset of the L2P table associated with the evicted bin.

Example 42 includes the subject matter of any of Examples 32-41, and wherein the means for writing the plurality of updates to the bin comprises means for determining an index of each update within the bin as a function of a subset of a logical address associated with each update.

Example 43 includes the subject matter of any of Examples 32-42, and wherein the means for determining the index of each update within the bin as a function of a subset of a logical address associated with each update comprises means for determining the index as a function of the 5 least significant bits of the logical address associated with each update.

Example 44 includes the subject matter of any of Examples 32-43, and further including means for determining whether a power-loss-imminent condition is present; and means for writing, in response to a determination that a power-loss-imminent condition is present, each bin from the volatile memory to the non-volatile memory.

Example 45 includes the subject matter of any of Examples 32-44, and further including means for receiving a read request; means for determining a logical address associated with the read request; means for determining whether a bin associated with the logical address is present in the volatile memory; and means for reading, in response to a determination that the bin associated with the logical address is present in memory, data from the non-volatile memory at a physical address indicated by an entry in the bin.

Example 46 includes the subject matter of any of Examples 32-45, and further including means for receiving a read request; means for determining a logical address associated with the read request; means for determining whether a bin associated with the logical address is present in the volatile memory; means for allocating, in response to a determination that the bin associated with the logical address is not present in the volatile memory, a new bin; means for reading a subset of the L2P table associated with the logical address into the allocated bin; and means for reading data from the non-volatile memory at a physical address indicated by an entry in the allocated bin.

The invention claimed is:

1. A device comprising:
a controller to:
allocate a bin in a volatile memory configured to store one or more bins, wherein each bin is indicative of a subset of contiguous entries that have been read into the bin from a logical to physical (L2P) table of a non-volatile memory, wherein the L2P table is indicative of logical addresses and associated physical addresses of data in the non-volatile memory;
write a plurality of updates to a subset of entries of the L2P table to the bin, including determining an index of each update within the bin as a function of a subset of a logical address associated with each update, to modify existing data that was read into the bin from the L2P table; and
write the bin to the L2P table in a single write operation.

2. The device of claim 1, wherein the non-volatile memory comprises a first memory device that includes write-in-place, byte-addressable memory and a second memory device that includes a different type of non-volatile memory.

3. The device of claim 1, wherein the L2P table is to be stored in a first non-volatile memory device and the data is to be stored at physical addresses in a second memory device that is different from the first memory device.

4. The device of claim 1, wherein the controller is further to determine whether a bin that matches a subset of the L2P table that is to be updated is present in the volatile memory, and
wherein to allocate the bin in the volatile memory comprises to allocate the bin in response to a determination that a bin that matches the subset of the L2P table is not present in the volatile memory.

5. The device of claim 4, wherein to determine whether a bin that matches the subset of the L2P table to be updated is present in the volatile memory comprises to compare a predefined number of bits of a logical address associated with the subset of the L2P table to be updated to at least one entry in each bin in the volatile memory.

6. The device of claim 5, wherein to compare a predefined number of bits comprises to compare the 27 most significant bits.

7. The device of claim 4, wherein the bin is a new bin, and the controller is further to evict an existing bin from the volatile memory to the non-volatile memory prior to the allocation of the new bin.

8. The device of claim 7, wherein the controller is further to update a code word for the subset of the L2P table associated with the evicted bin.

9. The device of claim 1, wherein to determine the index of each update within the bin as a function of a subset of a logical address associated with each update comprises to determine the index as a function of the five least significant bits of the logical address associated with each update.

10. The device of claim 1, wherein the controller is further to:
determine whether a power-loss-imminent condition is present; and
write, in response to a determination that a power-loss-imminent condition is present, each bin from the volatile memory to the non-volatile memory.

11. The device of claim 1, wherein the controller is further to:
receive a read request;
determine a logical address associated with the read request;
determine whether a bin associated with the logical address is present in the volatile memory; and
read, in response to a determination that the bin associated with the logical address is present in memory, data from the non-volatile memory at a physical address indicated by an entry in the bin.

12. One or more non-transitory machine-readable storage media comprising a plurality of instructions stored thereon that, when executed, cause a data storage device to:
allocate, with a controller of the data storage device, a bin in a volatile memory of the data storage device, wherein the bin is indicative of a subset of contiguous entries that have been read into the bin from a logical-to-physical (L2P) table stored in a non-volatile memory of the data storage device, and wherein the L2P table is indicative of logical addresses and associated physical addresses of data;
write, with the controller, a plurality of updates to a subset of entries of the L2P table to the bin, including determining an index of each update within the bin as a function of a subset of a logical address associated with each update, to modify existing data that was read into the bin from the L2P table; and
write, with the controller, the bin to the L2P table in a single write operation.

13. The one or more non-transitory machine-readable storage media of claim 12, wherein to write the bin to the L2P table comprises to write the bin to a first memory device that includes non-volatile, write-in-place, byte-addressable memory and a second memory device that includes a different type of non-volatile memory.

14. The one or more non-transitory machine-readable storage media of claim 12, wherein the plurality of instructions, when executed, further cause the data storage device to:
store, with the controller, the L2P table in a first non-volatile memory device; and
store, in a second memory device that is different from the first memory device, data at a physical address referenced by the L2P table.

15. The one or more non-transitory machine-readable storage media of claim 12, wherein the plurality of instructions, when executed, further cause the data storage device to:
determine, with the controller, whether a bin that matches a subset of the L2P table that is to be updated is present in the volatile memory, and
wherein to allocate the bin in the volatile memory comprises to allocate the bin in response to a determination that a bin that matches the subset of the L2P table is not present in the volatile memory.

16. The one or more non-transitory machine-readable storage media of claim 15, wherein to determine whether a bin that matches the subset of the L2P table to be updated is present in the volatile memory comprises to compare a predefined number of bits of a logical address associated with the subset of the L2P table to be updated to at least one entry in each bin in the volatile memory.

17. A method comprising:
- allocating, by a controller of a data storage device, a bin in a volatile memory of the data storage device, wherein the bin is indicative of a subset of contiguous entries that have been read into the bin from a logical-to-physical (L2P) table stored in a non-volatile memory of the data storage device, and wherein the L2P table is indicative of logical addresses and associated physical addresses of data;
- writing, by the controller, a plurality of updates to a subset of entries of the L2P table to the bin, including determining an index of each update within the bin as a function of a subset of a logical address associated with each update, to modify existing data that was read into the bin from the L2P table; and
- writing, by the controller, the bin to the L2P table in a single write operation.

18. The method of claim 17, wherein writing the bin to the L2P table comprises writing the bin to a first memory device that includes non-volatile, write-in-place, byte-addressable memory and a second memory device that includes a different type of non-volatile memory.

19. The method of claim 17, further comprising:
- storing, by the controller, the L2P table in a first non-volatile memory device; and
- storing, in a second memory device that is different from the first memory device, data at a physical address referenced by the L2P table.

* * * * *